US006928128B1

(12) United States Patent
Sidiropoulos

(10) Patent No.: US 6,928,128 B1
(45) Date of Patent: Aug. 9, 2005

(54) CLOCK ALIGNMENT CIRCUIT HAVING A SELF REGULATING VOLTAGE SUPPLY

(75) Inventor: Stefanos Sidiropoulos, Palo Alto, CA (US)

(73) Assignee: Rambus Inc., Los Altos, CA (US)

(*) Notice: Subject to any disclaimer, the term of this patent is extended or adjusted under 35 U.S.C. 154(b) by 0 days.

(21) Appl. No.: 09/303,669

(22) Filed: May 3, 1999

(51) Int. Cl.⁷ ................................................ H03D 3/24
(52) U.S. Cl. ...................... 375/376; 375/374; 327/157; 327/158; 713/500
(58) Field of Search .................................. 375/354, 357, 375/371, 373, 374, 376; 713/400, 401, 500, 503, 600, 601; 327/239, 269–272, 274, 276, 277, 280, 284, 530, 534–538, 540, 147–150, 156–159; 315/291; 455/260; 331/1 A, 8, 34; 365/233

(56) References Cited

U.S. PATENT DOCUMENTS

| | | | |
|---|---|---|---|
| 4,987,387 A | 1/1991 | Kennedy et al. | |
| 5,012,141 A | * 4/1991 | Tomisawa | 327/276 |
| 5,126,692 A | 6/1992 | Shearer et al. | 331/8 |
| 5,166,641 A | 11/1992 | Davis et al. | 331/1 A |
| 5,229,668 A | * 7/1993 | Hughes et al. | 327/271 |
| 5,315,623 A | 5/1994 | Kuo | |
| 5,334,951 A | 8/1994 | Hogeboom | 331/1 A |
| 5,334,953 A | 8/1994 | Mijuskovic | 331/8 |
| 5,339,009 A | * 8/1994 | Lai | 315/291 |
| 5,412,349 A | 5/1995 | Young et al. | 331/34 |
| 5,477,193 A | 12/1995 | Burchfield | 331/8 |
| 5,504,459 A | 4/1996 | Gersbach et al. | |
| 5,614,855 A | 3/1997 | Lee et al. | 395/376 |
| 5,642,082 A | 6/1997 | Jefferson | |
| 5,672,991 A | * 9/1997 | Thoma et al. | 327/239 |
| 5,687,201 A | 11/1997 | McClellan | 395/374 |
| 5,703,511 A | 12/1997 | Okamoto | 327/157 |
| 5,727,037 A | 3/1998 | Maneatis | 327/158 |
| 5,742,798 A | 4/1998 | Goldrian | |
| 5,796,673 A | 8/1998 | Foss et al. | 365/233 |
| 5,821,818 A | 10/1998 | Idei et al. | |
| 5,854,575 A | 12/1998 | Fiedler et al. | |
| 5,912,574 A | 6/1999 | Bhagwan | |
| 6,054,903 A | 4/2000 | Fiedler | |
| 6,107,835 A | * 8/2000 | Blomgren et al. | 326/98 |
| 6,247,138 B1 | * 6/2001 | Tamura et al. | 713/600 |
| 6,255,872 B1 | 7/2001 | Harada et al. | |
| 6,316,987 B1 | * 11/2001 | Dally et al. | 327/538 |

FOREIGN PATENT DOCUMENTS

JP       2000035831 A       2/2000

OTHER PUBLICATIONS

Dally et al., Digital Systems Engineering, cambridge, 1998, pp. 589–607.*

(Continued)

*Primary Examiner*—Chieh M. Fan
(74) *Attorney, Agent, or Firm*—Vierra Magen Marcus Harmon & DeNiro LLP

(57) ABSTRACT

Clock alignment circuits and techniques for reducing power dissipation, increasing power supply noise immunity, decreasing process and temperature variation sensitivity, and providing a wide operating range. A power supply generator generates an isolated supply voltage for a delay line used in a clock alignment circuit. The delay line generates a delayed clock from a reference clock. A comparator detects a correction information (i.e., delay or phase error) between the delayed clock and the reference clock and generates error information representative of the correction information. A charge pump circuit converts the error information into a voltage signal, wherein the voltage signal is a scaled representation of the error information. The power supply generator includes an amplifier having a first input coupled to the voltage signal and an output to provide the supply voltage and a capacitor coupled between the supply voltage and a ground voltage, wherein the amplifier tracks the voltage signal level to regulate the supply voltage.

21 Claims, 8 Drawing Sheets

OTHER PUBLICATIONS

J. Maneatis, "Low–jitter process–independent DLL and PLL based on self–biased techniques," IEEE Journal of Solid–State Circuits, vol., 31, No. 11, pp. 1723–1732, (Nov. 1996).

S. Sidiropoulos et al. "A Semi–digital dual Delay Locked Loop", IEEE Journal of Solid–State Circuits, vol., 32, No. 11, pp. 1683–1692, (Nov. 1997).

B. Garlepp et al., "A Portable Digital DLL Architecture for CMOS Interface Circuits", Proceedings of the 1998 Symposium on VLSI Circuits, pp. 214–215, (Jun. 1998).

V.R. Von Kaenel, "A High–Speed, Low–Power Clock Generator for a Microprocessor Application", IEEE Journal of Solid–State Circuits, vol., 33, No. 11, pp. 1634–1639, (Nov. 1998).

D.Draper et al., "Circuit Techniques in a 266–MHz MMX–Enabled Processor", IEEE Journal of Solid–State Circuits, vol., 32, No. 11, pp. 1650–1664, (Nov. 1997).

M. M. Griffin et al., "A Process–Independent, 800–MB/s DRAM Byte–Wide Interface Featuring Command Interleaving and Concurrent Memory Operation", IEEE Journal of Solid–State Circuits, vol., 33, No. 11, pp. 1741–1751, (Nov. 1998).

T. Saieki, "A Direct–Skew–Detect Synchronous Mirror Delay for Application–Secific Integrated Circuits", IEEE Journal of Solid–State Circuits, vol., 34, No. 3, pp. 372–379, (Mar. 1999).

T. Lee et al., "A 2.5V CMOS Delay–Locked Loop for an 18Mbit, 500Megabytes/s DRAM", IEEE Journal of Solid–State Circuits, vol., 29, No. 12, pp. 1591–1496, (Dec. 1994).

J. Sonntag et al. "A Monolithic CMOS 10MHz DPLL for Burst–Mode Data Retiming", IEEE International Solid State Circuits Conference (ISSCC) Feb. 16, 1990.

I. Novof et al., "Fully Integrated CMOS Phase–Locked Loop with 15 to 240 MHz Locking Range and +50 ps Jitter", IEEE Journal of Solid–State Circuits, vol. 30, No. 11, pp. 1259–1266, (Nov. 1995).

F. M. Gardner, "Charge–Pump Phase–Lock Loops", IEEE Trans. Comm., vol. COM–28, pp. 77–86, (Nov. 1980).

H. Kondoh et al., "A 622Mb/s 8×8 ATM Chip Set with Shared Multibuffer Architecture", IEEE Journal of Solid–State Circuits, vol. 28, No. 7, pp. 808–815, (Jul. 1993).

V von Kaenel et al., "A 320 MHz 1.5 mW @ 1.35 V CMOS PLL for Microprcessor Clock Generation", IEEE Journal of Solid–State Circuits, vol. 31, No. 11, pp. 1715–1722, (Nov. 1996).

D. Mijuskovic et al., "Cell–Based Fully Integrated CMOS Frequency Synthesizers", IEEE Journal of Solid–State Circuits, vol. 29, No. 3, pp. 271–279, (Mar. 1994).

I. Young et al., "A PLL Clock Generator with 5 to 110 MHz of Lock Range for Microprocessors", IEEE Journal of Solid–State Circuits, vol. 27, No. 11, pp. 1599–1607, (Nov. 1992).

H. Notani et al., "A 622–MHz CMOS Phase–Locked Loop with Precharge–type Phase Frequency Detector", IEEE 1994 Symposium on VLSI Circuits Digest of Technical Papers, pp. 129–130 (1994).

S. Sidiropoulos et al., "A CMOS 500Mbps/pin synchronous point to point link interface", IEEE 1994 Symposium on VLSI Circuits Digest of Technical Papers, pp. 43–44 (1994).

J. Alvarez et al., "A Wide–Bandwidth Low–Voltage PLL for PowerPC™ Microprocessors", IEEE 1994 Symposium on VLSI Circuits Digest of Technical Papers, pp. 37–38 (1994).

F. Rezzi et al., "A PLL–Based Frequency Synthesizer for 160–MHz Double Sampled SC Filters", IEEE Journal of Solid–State Circuits, vol. 31, No. 10, pp. 1560–1564, (Oct. 1996).

K. Lee et al., "A CMOS Serial Link for Fully Duplexed Data Communication", IEEE Journal of Solid–State Circuits, vol. 30, No. 4, pp. 353–363, (Apr. 1995).

D. K. Jeong et al., "Design of PLL–Based Clock Generation Circuits," IEEE Journal of Solid–State Circuits, vol. sc–22, No. 2, pp. 255–261, (Apr. 1987).

Wei et al., "A Variable–Frequency Parallel I/O Interface With Adaptive Power–Supply Regulation", IEEE Journal of Solid–State Circuits, vol. 35, No. 11, Nov. 2000.

* cited by examiner

CLOCK ALIGNMENT CIRCUIT HAVING A SELF REGULATING VOLTAGE SUPPLY

BACKGROUND OF THE INVENTION

This invention relates to circuits and techniques for generating clock signals which have predetermined temporal relationships with reference signals. More specifically, this invention relates to clock alignment circuits and techniques, for use in high speed integrated circuit devices, which generate clock signals having a synchronous, precisely controlled, and/or predetermined relationship with reference signals and which exhibit wide operating ranges in clock alignment, reduced power dissipation, increased power supply noise immunity, and decreased process and temperature variation sensitivity.

Clock alignment circuits are required in many of today's high speed integrated circuit devices to generate a clock signal having a certain timing relationship with a reference signal. In short, clock alignment circuits are employed to generate clock signals having a synchronous, precisely controlled, and/or predetermined relationship with a reference signal (e.g., an external clock signal). By integrating clock alignment circuitry into a clock system of, for example, a microprocessor or synchronous memory device, difficulties relating to maintaining or ensuring signal integrity and clock skew may be overcome. In addition, reliable clocking operations which support very high speed circuit implementations may be achieved.

Examples of clock alignment circuits and techniques include phase lock loop (PLL), and delay lock loop (DLL) circuits among many others. A PLL circuit, for example, utilizes a voltage controlled oscillator (VCO) to generate a recovered clock signal having a certain timing relationship with the reference signal. Similarly, a DLL may employ a voltage controlled delay line (VCDL) to generate the recovered clock signal. Both of these types of clock alignment circuits involve techniques which detect a phase or delay error between the internal clock signal and the external clock signal (reference signal) and provide a feedback loop to compensate for the phase or delay error between the signals.

A shortcoming of some conventional clock alignment circuitry and techniques is the ability to consistently address power supply noise generated by large switching circuits (e.g., output drivers). Large currents and fast switching of these circuits tend to induce noise on power supply systems. The power supply systems, in addition to providing power to the switching circuits, also supply power to clock circuitry located on the same integrated circuit substrate. Noisy power supplies tend to distort or skew a clock signal generated in, for example, a delay element in a DLL or PLL system. Power supply noise may also introduce variations between clock cycles of internal clock signals used in the clock alignment system on an integrated circuit device.

Furthermore, substrate or ground induced noise, variations in semiconductor processing, and changing temperatures may also cause distortions in clock signals. Noise sources and environmental effects may impose a serious limitation to the performance of clock alignment circuit designs.

A schematic block diagram of a conventional clock alignment system based on a DLL approach is shown in FIG. 1. DLL clock alignment system 1 includes a reference clock 16 and an output clock 15 each inputting into a phase comparator 11. The output clock 15 represents an internally compensated (i.e. delayed clock) or recovered clock which is to be "locked" by a delay relationship to the reference clock 16 (i.e. input clock). The phase comparator 11 detects any relative phase misalignment between the reference clock and the output clock 15 and generates an UP output 17 and a DN output 18 to indicate a relatively early or late phase misalignment (i.e., phase error). The outputs 17 and 18 are then applied to a charge pump circuit 12 which integrates the UP and DN outputs 17 and 18 into a charge pump voltage ($V_{cp}$) on output line 19.

A bias generator circuit 13 receives the charge pump voltage ($V_{CP}$) and generates a PMOS transistor bias voltage ($V_{BP}$) on output line 20, and an NMOS transistor bias voltage ($V_{BN}$) on output line 21. Both $V_{BP}$ and $V_{BN}$ scale relative to $V_{CP}$ to bias delay elements in a voltage controlled delay line (VCDL) 14. The VCDL 14 will delay the reference clock 16 by a fixed amount which is defined by the phase error to form the output clock 15 such that there is negligible or no detected phase error between the reference clock 16 and the output clock 15.

Here, the output clock 15 is immune from power supply noise since any skew in the output clock 15 resulting from a power supply fluctuation is detected and corrected by tracking the delay through the VCDL 14. The delay through the VCDL 14 is tracked in accordance to the integrated phase error resulting from any skew caused by the power supply fluctuation.

A schematic block diagram of a conventional clock alignment system using a PLL approach is shown in FIG. 2. The structure and operation of PLL clock alignment system 2 is similar to the structure and operation of DLL clock alignment system 1 illustrated in FIG. 1. In the PLL clock alignment system 2, however, a VCO is employed in place of a VCDL. Briefly, with reference to FIG. 2, a reference clock 26 and an output clock 25 are input into a phase comparator which generates a phase error information in the form of UP output 27 and a DN output 28. A charge pump circuit 22 integrates the UP and DN outputs 27 and 28 into a charge pump voltage 29. A bias generator 23 generates a PMOS transistor bias voltage ($V_{BP}$) on output line 30 and an NMOS transistor bias voltage ($V_{BN}$) on output line 31. Both $V_{BN}$ and $V_{BP}$ scale with $V_{CP}$ to bias delay elements in a VCO 24. The negative feedback in the loop adjusts the VCO output frequency by integrating the phase error that results between the reference clock 26 and the output clock 25. As in the DLL clock alignment system 1 of FIG. 1, output clock 25 in FIG. 2 tends to be immune from power supply noise since any skew in the output clock 15 resulting from power supply fluctuations is detected and corrected by tracking the skew through the VCO 24.

Conventional DLL and PLL circuits attempt to minimize susceptibility to noise by using delay elements which have low sensitivity to power supply noise. The delay elements used in the conventional VCDL and the VCO of FIGS. 1 and 2 attempt to accomplish this by employing a differential buffer delay stage. With reference to FIG. 3, a conventional differential buffer delay stage 300 includes a symmetric source coupled pair of input transistors 301 and 302, each coupled in series with symmetric load elements. Each symmetric load element includes a diode connected PMOS device 305 connected in shunt with an equally sized PMOS device 304. Each of the PMOS load device 304 is biased by the PMOS transistor bias voltage ($V_{BP}$) generated in FIGS. 1 and 2. Similarly, an NMOS pulldown bias transistor 307 is biased by the NMOS transistor bias voltage ($V_{BN}$) generated in FIGS. 1 and 2. These transistor bias voltages $V_{BP}$ and $V_{BN}$, are continuously adjusted to provide a correct current flowing through the delay stage 300 independent of supply voltage. If the supply voltage changes, $V_{BP}$ and $V_{BN}$ will compensate to keep a constant current flowing through the delay stage 300.

The conventional techniques and circuitry described above often allow for a very broad frequency range of operation. In addition, the conventional techniques provide some immunity from adverse effects based on the process technology of the integrated circuit and environmental conditions as well as power supply fluctuations. However, conventional differential amplifier type delay elements tend to consume high levels of static power. As such, these delay elements are undesirable or not compatible for use in many applications—for example applications which require low power dissipation, such as, portable battery operated applications. Indeed, the differential amplifier type delay elements of FIG. 3 dissipates more static power than typical static inverter type elements. Static inverter elements, while having negligible static power dissipation, tend to be much more susceptible to power supply fluctuations than differential amplifier type delay elements.

Thus, conventional clock alignment circuit employing differential elements in a delay line may provide the advantage of high noise immunity but tend to suffer from unacceptable power consumption levels. Employing static inverter elements in the delay line as a substitute for differential elements may solve concerns relating to power consumption but may also introduce a considerably lower noise immunity than differential delay elements.

In an effort to overcome the lower noise immunity concerns presented by static inverter elements, conventional clock alignment circuits have employed regulated power supplies to power inverter type delay elements. One such regulated power supply which offers some relief to lower noise immunity of the inverter type delay line elements is illustrated in FIG. 4. With reference to FIG. 4, a band gap voltage regulator 400 provides a power supply to inverter type delay line elements (not shown). Here, the band gap voltage regulator 400 includes an internal band gap voltage reference generator 401 which generates a reference voltage ($V_{REF}$). The reference voltage $V_{REF}$ is applied to a regulator 402 to generate an internal supply voltage at an output node 403. The internal supply voltage powers the inverter type delay elements in the delay line. The internal band gap voltage reference generator 401 is regulated from any power supply noise or fluctuations and provides a stable voltage since it is based on a physical constant of silicon.

There are a number of drawbacks in using the regulated power supply approach to improve immunity from power supply noise. For example, implementing the band gap regulator 400 may require special analog circuit design techniques. In addition, the band gap regulator 400 may consume unacceptable levels of power at low clock alignment system operating frequencies. Moreover, a portion of the clock alignment circuitry may have to operate at a lower supply voltage, thereby adding additional design complexity. Thus, although the noise susceptibility of the static inverter element may be improved through the use of the band gap regulator 400, the improvement is realized at the cost of increased complexity and power consumption.

As an alternative, conventional clock alignment circuits have employed a dedicated pin to provide a "quite" power supply. By providing a dedicated pin to supply power to delay line elements, much of the complexity involved with the band gap regulator 400 may be avoided. In addition, by employing static inverter type delay elements, significant noise immunity may be realized along with negligible static power consumption penalty. However, the dedicated pin approach may require additional area on an integrated circuit for the inclusion of an extra bond pad. In addition, the dedicated pin approach may have limited applications. For example, applications where additional pins do not significantly impact the feasibility of a design. Also, the dedicated pin approach may render the clock alignment circuitry susceptible to other sources of noise such as ground induced noise or substrate coupled noise.

Thus, in sum, although clock alignment circuits employing differential delay elements provide a relatively high noise immunity, such circuits suffer from unacceptable power consumption levels. Static inverter elements employed in the delay line may have lower power consumption (relative to differential delay elements) but have the disadvantage of lower noise immunity. Although noise susceptibility of the static inverter element may be improved through the use of regulated power supplies, such as a bandgap regulator, such a configuration may also impose undesirable complexity and consume excess power. A dedicated power supply pin may solve the noise susceptibility concerns of the static inverter element, however dedicated pin designs tend to impose additional integrated circuit area requirements and may have limited applications.

Accordingly, there is a need for clock alignment circuits which overcome the shortcomings of conventional circuitry for use in high speed integrated circuit devices to generate the output clock having a predetermined or synchronous timing relationship with the reference signal. In addition, there exists a need for circuits and techniques to minimize effects due to process and temperature variations which notably overcome disadvantages of conventional clock alignment circuitry. There is a need for an approach which offers lower relative power consumption advantages while having high immunity to noise sources.

The static inverter delay line element approach may offer inherent static power consumption but may otherwise exhibit poor noise susceptibility. The regulated supply approach while providing increased noise immunity to the static inverter delay line element, may require undesirable complexity and exhibit unscalable power consumption. Thus, there is also a need for a regulator circuit which introduces a minimal amount of additional complexity and may be included in a clock alignment circuit. There is a need for such a regulator circuit to achieve power dissipation which scales with operating frequency and process speed. In this regard, as operating frequency decreases, the delay element will consume less power in scaled proportion. Moreover, there is a need for a circuit and technique which may be ported to a process which supports faster circuit operation while consuming less power.

SUMMARY OF THE INVENTION

The present invention relates to clock alignment circuits and techniques for use in high speed integrated circuit devices, which generate clock signals having a synchronous, precisely controlled, and/or predetermined relationship with reference signals. The clock alignment circuits and techniques of the present invention exhibit wide operating range, reduced power dissipation, increased power supply noise immunity, increased immunity to noise induced jitter, and decreased process and temperature variation sensitivity.

In a first principal aspect, the present invention is a clock alignment circuit which includes a delay line having a plurality of delay elements (e.g., differential delay elements or inverter delay elements) to generate a delayed clock signal with respect to a reference clock signal. The delay elements each include a supply electrode to receive a supply voltage.

The clock alignment circuit also includes a delay comparator, charge pump circuitry, an amplifier, and a capacitor. The delay comparator compares the delayed clock signal and the reference clock signal and outputs delay differential information. The delay differential information is representative of correction information (i.e., phase or delay error) between the reference clock signal and the delayed clock signal. Correction information may be defined as any deviation or skew between the intended or predetermined relationship between the reference clock signal and the delayed clock signal—such as phase error or delay error.

The charge pump circuitry of this aspect of the invention converts the delay differential information to a control signal. The control signal is proportional to the delay differential information.

The amplifier, which is coupled to the charge pump circuitry, includes a first input (e.g., the non-inverting input) to receive the control signal, a second input (e.g., the inverting input) to receive a feedback signal, and an output to provide the supply voltage and the feedback signal.

The capacitor is coupled between the supply voltage (and feedback signal) and a secondary power supply terminal to filter high frequency signals.

In a second principal aspect, the present invention is a power supply generator circuit for regulating a power supply of a clock alignment circuit. The power supply generator isolates power supply noise and provides immunity from power supply fluctuations. The power supply generator of this aspect of the invention includes an operational amplifier having an output to provide the first supply voltage. The operational amplifier includes a differential amplifier coupled to a bias transistor, wherein the bias transistor is biased by a bias voltage. The differential amplifier includes a first differential input coupled to the control signal and a second differential input coupled to the output in a non-inverting configuration.

The operational amplifier also includes a bias generator having a first input to receive the control signal and a second input to receive the bias voltage. In response to the control voltage, the bias generator provides a bias voltage which is representative of a change in the control voltage. Finally, the operational amplifier includes a capacitor coupled between the output and a supply terminal.

The present invention is described in the detailed description to follow. It should be understood that the detailed description and specific examples are given by way of illustration only. Various changes and modifications of the specific examples are within the spirit and scope of the invention.

BRIEF DESCRIPTION OF THE DRAWINGS

In the course of the detailed description to follow, reference will be made to the attached drawings, in which.

DETAILED DESCRIPTION

The present invention is a clock alignment circuit and technique for generating a clock signal having a defined, synchronous and/or predetermined timing relationship with respect to a reference clock signal (for example, the clock signal may be delay synchronized with the reference signal such that there is little to no delay error between the clock signal and reference clock signal or the clock signal may be frequency synchronized such that there is little to no, or negligible, phase error between the clock signal and reference clock signal). The clock alignment circuitry (or clock compensation circuitry) and technique of the present invention employs circuits and techniques to regulate the power supply voltage while providing significant immunity to power supply noise or other noise sources.

In one embodiment, a power supply circuit of the present invention is included in a feedback system of the clock alignment circuit. The power supply circuit includes an operational amplifier regulator to regulate a power supply voltage for a plurality of delay line elements in a delay line. The operational amplifier may be arranged in a unity gain feedback configuration and may include a decoupling capacitor. This capacitor is coupled between the power supply voltage and ground to filter the power supply noise. The power supply circuit of this embodiment tends to minimize effects due to process and temperature variations and maintains a reliable and consistent operation within a given temperature range. In addition, this power supply circuit also provide significant immunity to substrate coupled noise and ground voltage fluctuations.

The clock alignment circuit and technique of the present invention employs means to reduce power dissipation as well as provide a wide operating range. In this regard, an operational amplifier bias current (used by the power supply) is scaled or scalable along with a delay line supply voltage. The scalability of the operational amplifier bias current and delay line supply voltage allows the clock alignment circuit of the present invention to limit, reduce or control overall power dissipation based on, for example, process and operating frequency. Indeed, in a preferred embodiment, the operational amplifier supply voltage regulator achieves a constant bandwidth to operating frequency ratio and a wide locking range.

Figure 1:
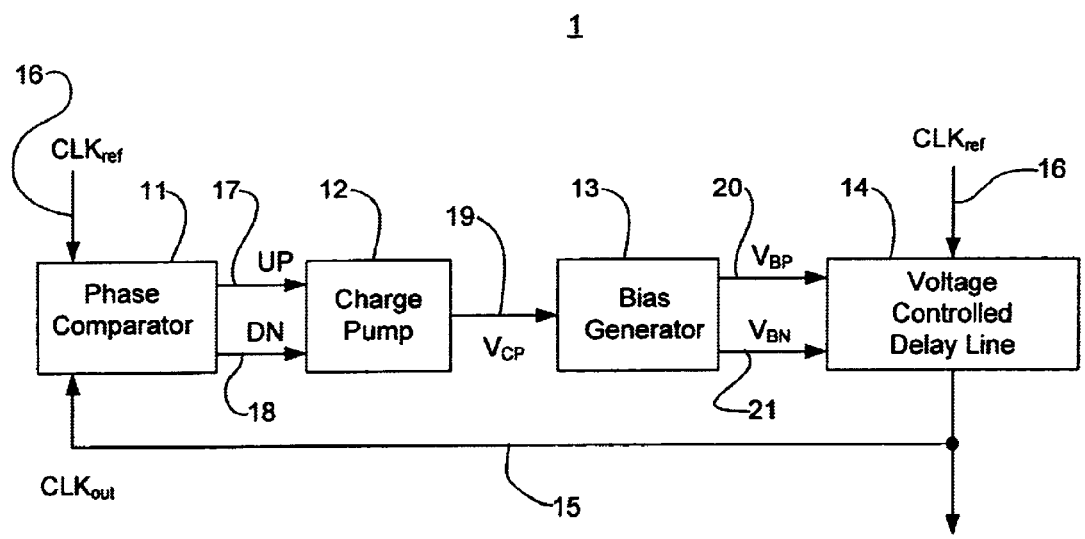
FIG. 1 is a schematic block diagram representation of a conventional DLL clock alignment circuit.
Figure 2:
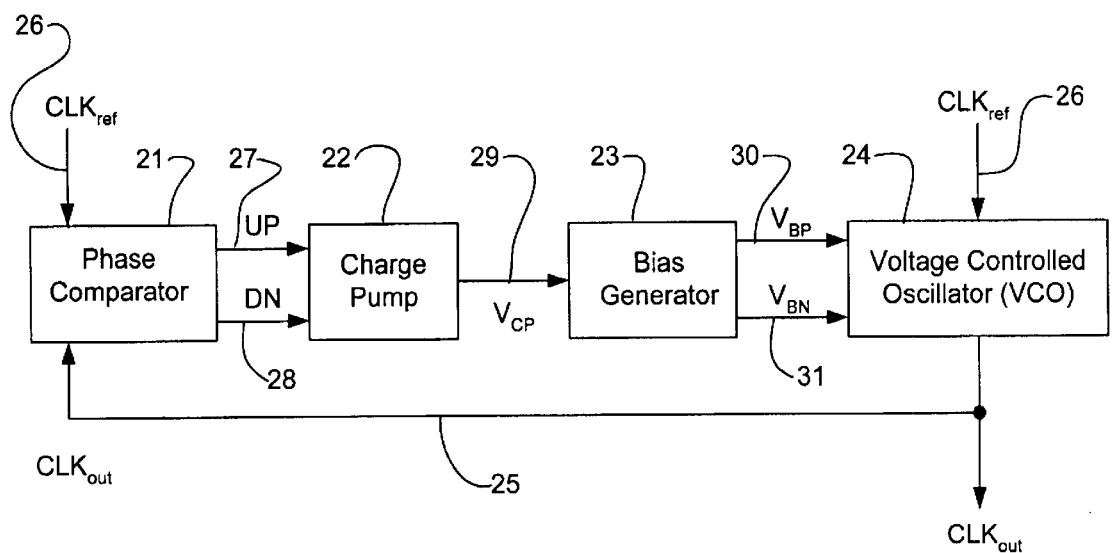
FIG. 2 is a schematic block diagram representation of a conventional PLL clock alignment circuit.
Figure 3:
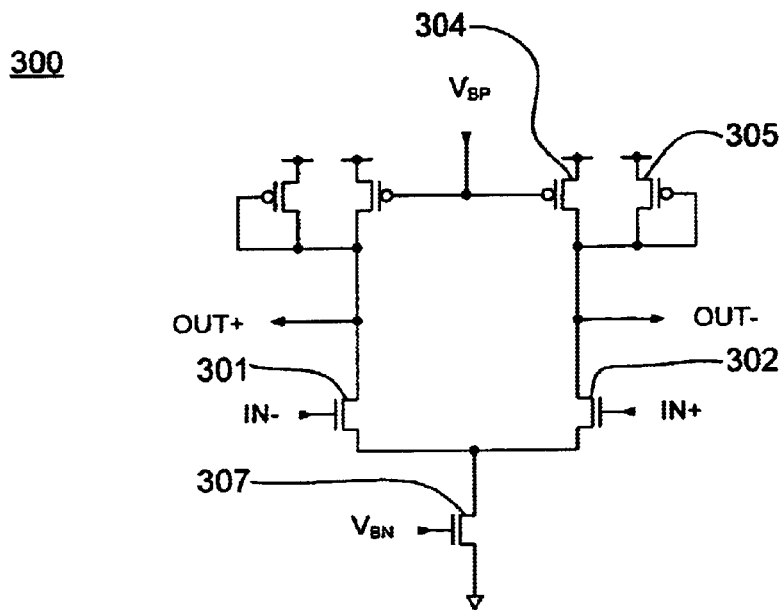
FIG. 3 is a circuit schematic of a conventional biased differential delay element used in clock alignment circuits.
Figure 4:
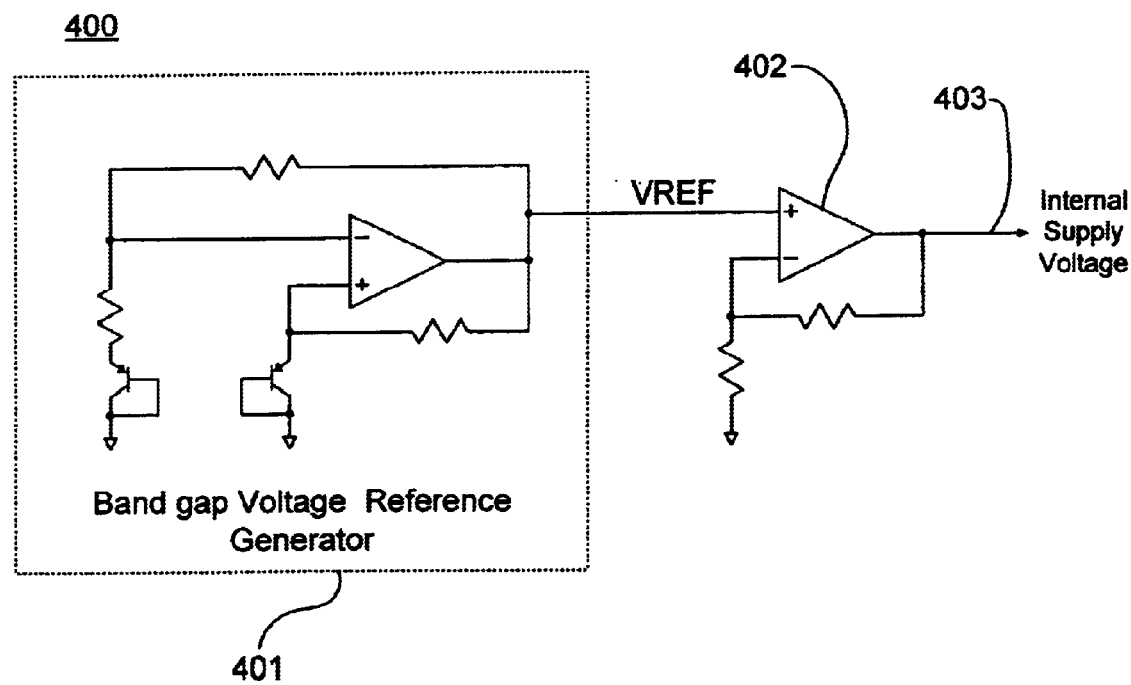
FIG. 4 is a circuit schematic of a conventional band gap voltage regulator supply generator which may be utilized to address supply noise immunity issues in conventional clock alignment circuits.
Figure 5:
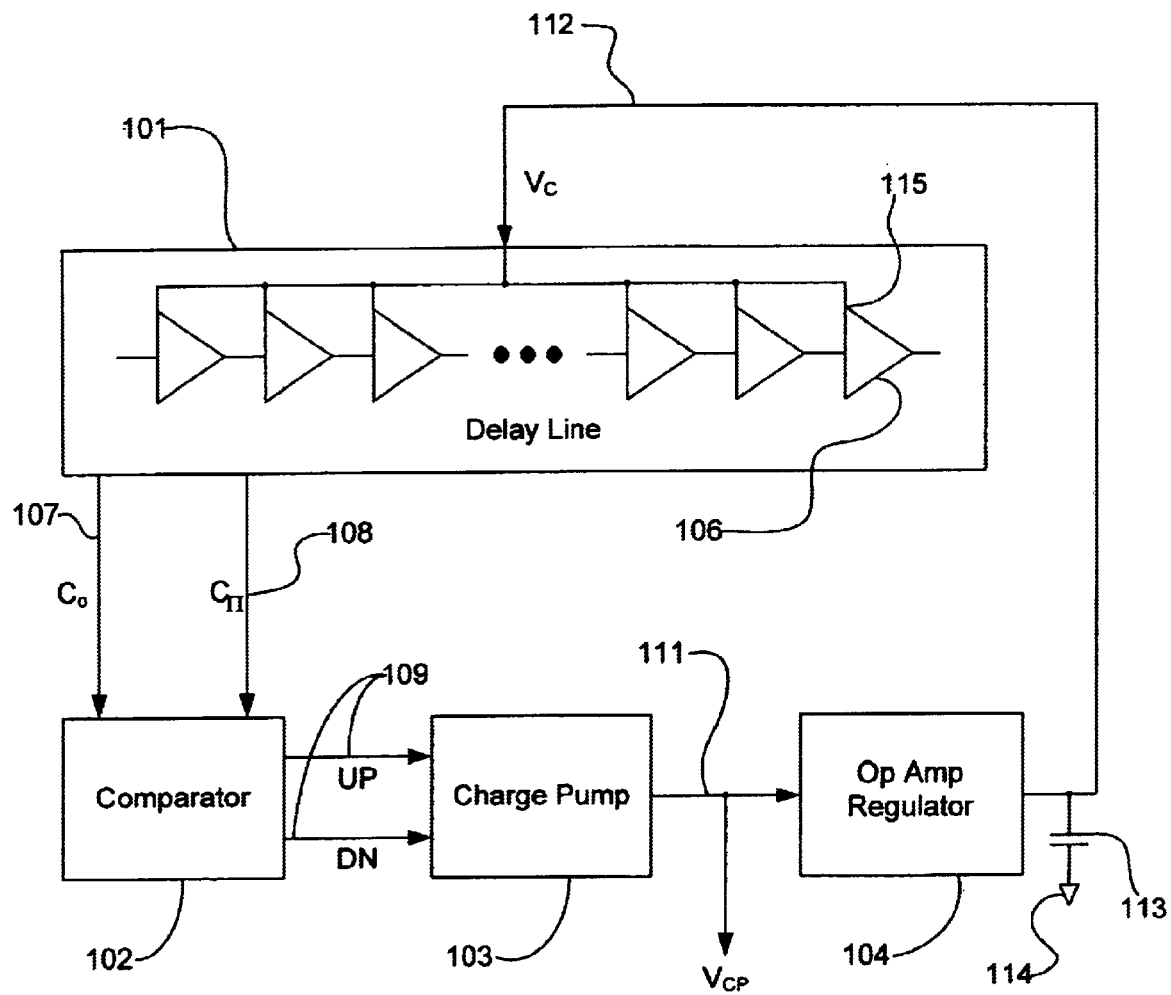
FIG. 5 is a schematic block diagram representation of a clock alignment circuit according to one embodiment of the present invention.

With reference to FIG. 5, one embodiment of clock alignment circuitry 100 includes a comparator 102, a charge pump 103, an operational amplifier regulator 104, and a delay line 101. Briefly, by way of overview, the comparator 102 compares a reference clock 107 with a delayed clock 108 to generate correction information 109. The comparator 102 outputs the correction information 109 to a charge pump 103. The charge pump integrates the correction information 109 and outputs a charge pump voltage $V_{CP}$ to the charge pump output 111. The charge pump output 111 is applied to the regulator 104 to produce a power supply signal 112 such that $C_O$ and $C_n$ are delay aligned with the correction information 109. The power supply signal 112 provides a power supply voltage $V_C$ to the delay line 101. The charge pump output 111 may be characterized as a linear representation of the amount of clock correction required due to, for example, supply noise, temperature variations, and substrate coupled noise. By providing this information directly to the regulator 104, and ultimately to supply the delay line 101, these clock error inducing effects are compensated.

The delay line 101 includes a plurality of delay elements. Each delay element 106 includes a supply electrode 115, for example, a MOS transistor source electrode, to receive the supply voltage signal 112. The delay line 101 may generate a delayed clock signal 108 with respect to a reference clock signal 107. In addition, the delay element 106 may be of any of the conventional types of delay elements available. As an example, delay element 106 may be a static CMOS inverter having a PMOS pull-up transistor which is source connected to the power supply voltage signal 112. In those instances where consumption of static power tends to be less of a concern, the delay line 101 may comprise differential elements having load elements source connected to the power supply voltage signal 112. As mentioned above, the differential element, while consuming more static power tends to offer improved noise immunity over the static CMOS inverter.

In a preferred embodiment of the present invention, a delayed clock signal 108 has a 180° phase shift with respect to the reference clock signal 107. Other phase relationships may be suitable for the phase relationship between the reference clock signal 107 and the clock signal 108. For example, a quadrature clock may be generated from the reference clock to have a delayed clock signal phase shift of 90°.

The delay line 101 generates a delayed clock signal 108 with respect to a reference clock signal 107. Delay line 101 receives the reference clock signal 108 to generate the delayed clock signal 108. Alternatively, the reference clock signal 107 and the delayed clock signal 108 may both be taken as "taps" from the delay line 101 to define a phase relationship there between. For example, the delay line 101 may include six delay elements, each delay element providing a 30° phase shift.

Figure 6:
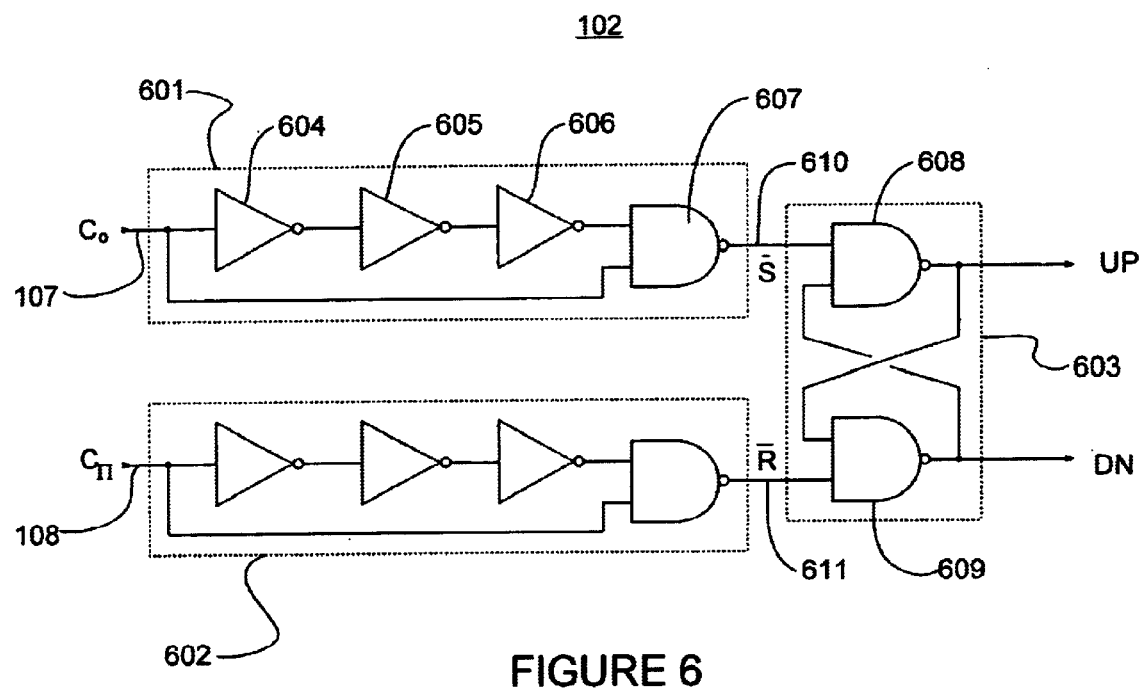
FIG. 6 is a circuit schematic of a comparator according to one embodiment of the present invention.

The clock compensation circuitry 100 includes the comparator 102 to compare the delayed clock signal 108 and the reference clock signal 107 and to output correction information 109. FIG. 6 illustrates the comparator 102 of FIG. 5 in detail. The comparator 102 includes a first pulse generator 601, a second pulse generator 602, and a latch circuit 603. The first pulse generator 601 receives the reference clock signal 107 to generate a set pulse 610 in response to a clock transition of the reference clock signal 107. The second pulse generator 602 receives the delayed clock signal 108 to generate a reset pulse 611 in response to a clock transition of the delayed clock signal 108. The latch circuit 603 receives the set pulse 610 at a set input and the reset pulse 611 at the reset input to generate relative phase related data—that is, data which is representative of the phase relationship between the reference clock signal 107 and the delayed clock signal 108.

In particular, the first pulse generator 601 includes inverter elements 604, 605, and 606 coupled to logic NAND gate 607. A rising edge transition of the reference clock signal 107 causes both inputs of the NAND gate 607 to switch to a logic high state for a pulse duration defined by the propagation delay of inverter elements 604 to 606. The NAND gate 607 initially at a logic high state, logically outputs the set pulse 610 at a logic low state for the pulse duration before returning to the logic high state. The set pulse 610 pulses low to set the latch circuit 603 into a set state and triggers the UP output into a high state.

The second pulse generator 602 has a similar structure and operation to the first pulse generator 601. The second pulse generator 602 receives the delayed clock signal 108 to generate a reset pulse 611 in response to a clock transition of the delayed clock signal 108. A rising edge transition of delayed clock signal 108 triggers the reset pulse 611 to reset the latch circuit 603 into a reset state thereby triggering the DN output into a high state.

In this embodiment, binary signal UP is a pulse whose duration is proportional to a phase error misalignment which relates to a rising edge of reference clock signal 107 occurring before a rising edge of the delayed clock signal 108. The binary signal DN is a pulse whose duration is proportional to a phase error misalignment relating to a rising edge of reference clock signal 107 occurring after a rising edge of the delayed clock signal 108.

In a preferred embodiment, the comparator 102 is a linear phase detector which receives two clocks which are 180° apart and generates an UP and a DN output whose pulse duration is proportional to a phase error there between. It should be noted however, other types of phase detector circuits may be implemented in the present invention to detect the phase error. For example, a quadrature phase detector which detects a phase error between two clocks being 90° apart. In addition, a binary "bang-bang" phase detector is also suitable and may be readily implemented into the present invention.

Figure 7:
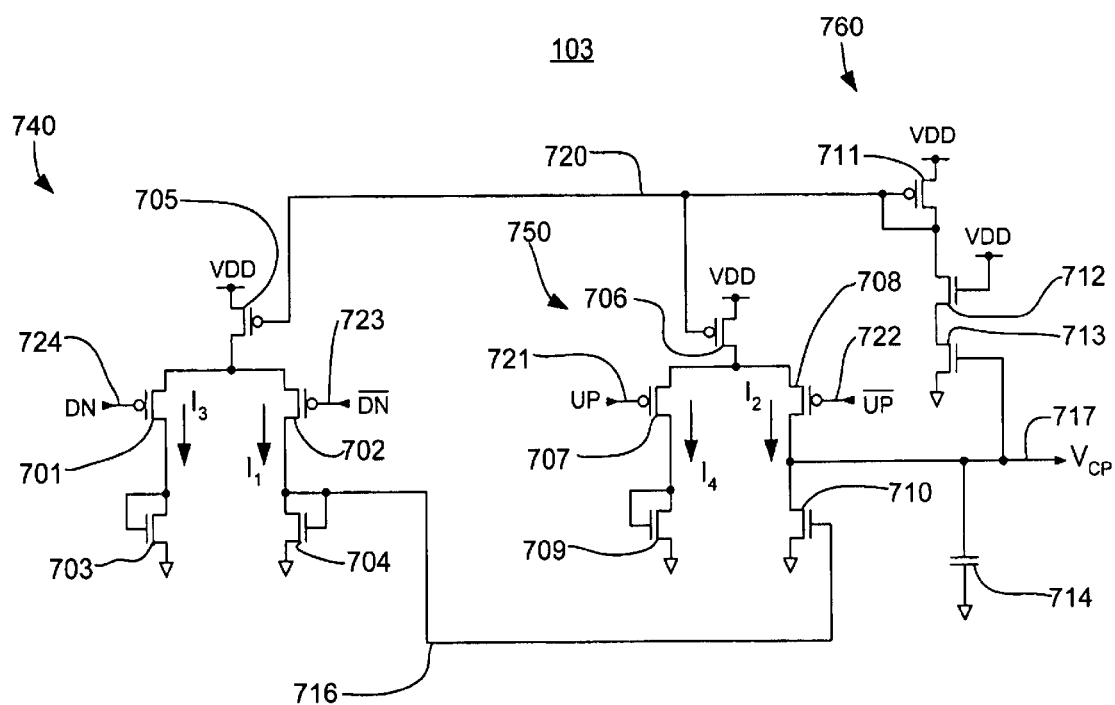
FIG. 7 is a circuit schematic of a charge pump according to one embodiment of the present invention.

FIG. 7 illustrates a charge pump circuit 103 of FIG. 5 in detail. The charge pump circuit 103 converts the delay differential information signals UP and DN to a proportional charge pump voltage ($V_{CP}$) on line 717. The charge pump circuit 103 includes a first pump circuit 740, a second pump circuit 750, and a current source control circuit 760.

The first pump circuit 740 includes an input transistor 702 coupled in series with a current source 705. The input transistor 702 is also coupled in series with a load transistor 704. The input transistor 702 has a gate electrode to receive a first phase input 723. The input transistor 702 also includes a drain electrode to provide a first pump output 716. The current source 705 responds to a bias control signal 720 to vary a current flowing between a supply voltage and the input transistor 702.

The second pump circuit 750 includes an input transistor 708 coupled in series with a current source 706. The input transistor 708 is also coupled in series with a second load transistor 710. The second load transistor 710 includes a gate electrode to receive the first pump output 716. The input transistor 708 includes a gate electrode coupled to a second phase input 722. The input transistor 708 also includes a drain electrode to provide $V_{CP}$ on line 717. The current source 706 responds to a bias control signal 720 to vary a current flow between the supply voltage and the input transistor 708.

The current source control circuit 760 includes a control input transistor 713 coupled in series with a current mirror transistor 711. The control input transistor 713 is coupled to respond to the charge pump voltage $V_{CP}$ to feed back the bias control signal to the current sources 705 and 706 respectively using the current mirror transistor 711. The current source control circuit 760 responds to $V_{CP}$ and increases or decreases a current of the bias control signal 720. In this embodiment, an increase or decrease in voltage on line 717 provides a scaled current to flow through current mirror transistor 711 which provides the bias control signal 720. The scale factor may be selected by adjusting the gate length of the current mirror transistor 711.

Depending on the logic state of the first phase input 723, a first current $I_1$ will be provided by the transistor 702 in the first pump circuit 740 through a path which includes the load transistor 704, the input transistor 702 and the current source 705. The first current $I_1$ will bias a second current $I_2$ in the second pump circuit 750 via the first pump output 716. The second phase input 722 is logically complementary to the first phase input 723 to operate the second charge pump circuit in a push—pull fashion. The second current $I_2$ will be provided by the second load transistor 710. The second current $I_2$ is provided in a path which includes the second current source 706, the second input transistor 708 and the second load transistor 710.

The first pump circuit 740 includes an input transistor 701, coupled in between the current source 705, and a load transistor 703 (i.e., a diode connected NMOS transistor). The input transistor 701 includes a gate electrode to receive a third phase input 724.

The second pump circuit 750 also includes an input transistor 707, coupled in between the second current source 706, and a load transistor 709 (i.e., a diode connected NMOS transistor). The input transistor 707 has a gate electrode coupled to receive a fourth phase input 721.

The preferred embodiment includes a third current $I_3$ in the first pump circuit 740 in addition to the first current $I_1$. The first pump circuit 740 establishes the third current $I_3$ in a path which includes the current source 705, the third input transistor 701 and the third load transistor 703. This path enhances the operation of the first pump circuit 740 by maintaining a bias voltage at the common source node of input transistors 701 and 702.

Similarly, in addition to the second current $I_2$, the second pump circuit 750 also establishes a fourth current $I_4$ in the second pump circuit 750. The fourth current $I_4$ is established in a path which includes the current source 706, the fourth input transistor 707 and the fourth load transistor 709. This path enhances the operation of the second pump circuit 740 by maintaining a bias voltage at the common source node of input transistors 721 and 722.

With continued reference to FIG. 7, the current source control 760 circuit includes a current mirror transistor 711 having a source electrode coupled to the supply voltage. The transistor 711 includes a gate electrode coupled to a drain electrode and is in series with a pass transistor 712. In addition, the transistor 711 is coupled in series with the control input transistor 713 to supply the bias control signal 720. The bias control signal 720 is coupled to a gate of current sources 705 and 706. The control input transistor 713 includes a gate electrode coupled to receive $V_{CP}$, and a drain electrode coupled to the bias control signal 720 through the pass transistor 712. In this embodiment, pass transistor 712 is an NMOS transistor having a gate electrode coupled to VDD to isolate the bias control signal 720 from the control input transistor 713. In operation the current source control circuit 760 scales a feedback current of the bias control circuit 720 to the current sources 705 and 706 of the first and the second pump circuit in proportion to $V_{CP}$. That is the control input transistor 713 responds to $V_{CP}$ to allow a current to flow through the pass transistor 712. This current provides the bias control signal 720 such that it is varied in accordance to $V_{CP}$. The bias control signal 720 modulates current sources 705 and 706 in accordance to a scale factor.

Figure 8:
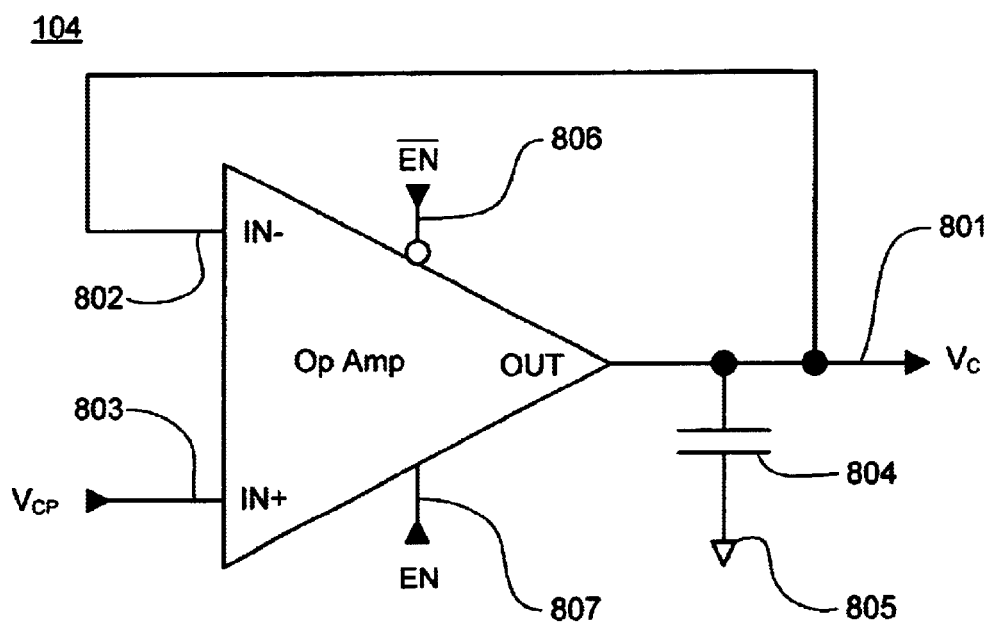
FIG. 8 is a schematic block diagram representation of an operational amplifier type voltage supply generator according to an embodiment of the present invention.

The clock compensation circuitry 100 includes an op amp regulator which receives the charge pump voltage $V_{CP}$ and provides the supply voltage $V_C$. With reference to FIG. 8, the operational amplifier 104 of FIG. 5 is further illustrated in detail. The operational amplifier 104 provides the power supply voltage $V_C$ at output 801. The operational amplifier 104 is configured in a unity gain mode to have a positive gain by feeding the power supply voltage $V_C$ to the inverting input 802. Furthermore, the operational amplifier 104 responds to $V_{CP}$ at a non inverting input 803 to provide the power supply voltage $V_C$ with reduced sensitivity to noise sources. A capacitor 804 is coupled between $V_C$ at output 801 and a secondary power supply 805, for example a ground voltage, to provide additional high frequency dampening to the power supply voltage $V_C$.

The operational amplifier 104 in this embodiment includes complementary enabling/disabling inputs 806 and 807 to control the operation of the operational amplifier 104. The complementary enabling inputs 806 and 807 may enable or disable the operational amplifier 104. In the disable state, the operational amplifier 104 tends to exhibit decreased power dissipation. Thus, when the clock alignment system is in an inactive or reset state, the operational amplifier 104 may be disabled and the power dissipation correspondingly decreases.

Figure 9:
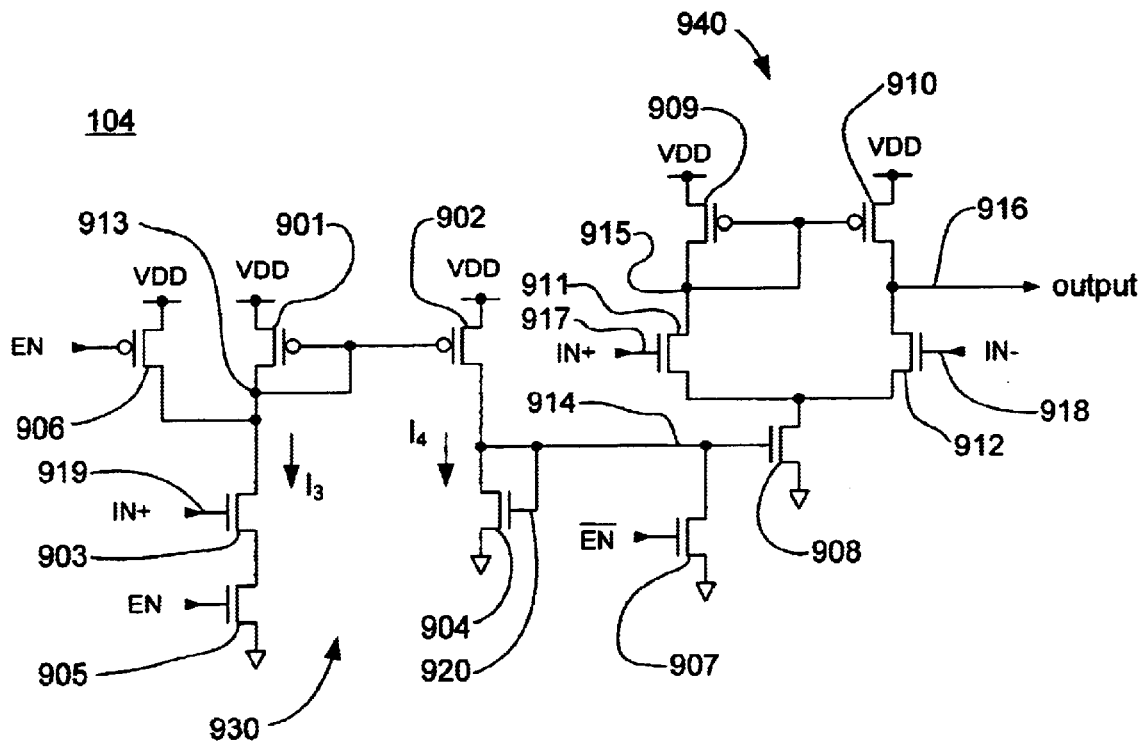
FIG. 9 is a circuit schematic of an operational amplifier according to an embodiment of the present invention.

With reference to FIG. 9, the operational amplifier 104 of FIG. 8 is further illustrated in detail. The operational amplifier 104 includes a bias generator 930, a bias transistor 908, and a differential amplifier 940. The bias generator 930 generates a bias voltage which is applied to the bias transistor 908. The bias voltage biases and modulates (at circuit node 914) the bias transistor 908. Here, the bias voltage controls the bias transistor 908 so as to increase or decrease the amount of current flowing through bias transistor 908. The bias transistor 908 acts as a current source for the differential amplifier 940.

A common input IN+ is applied to a non-inverting input signal 919 of the bias generator 930 and a first differential input 917 of the differential amplifier 940. The common input IN+ responds to the charge pump voltage $V_{CP}$ (not illustrated) and modulates the bias voltage at circuit node 914 using the bias generator 930. Also, the voltage at output 916 is varied according to the common input IN+ to provide the supply voltage $V_C$ proportionally.

In detail, the differential amplifier 940 includes a current mirror load circuit having a first load transistor 909 coupled in parallel with a second load transistor 910. An input transistor 911 is coupled in series with the load transistor 909. An input transistor 912 is coupled in series with the load transistor 910 to provide a current flowing through output node 916.

The bias generator 930 includes transistors 903 and 904. The transistor 903 is coupled in series with the load transistor 901 to provide a current $I_3$. The current $I_3$ flowing through node 913 biases the load transistors 901 and 902 to mirror a current $I_4$ to flow in the same direction through node 914. The current $I_4$ flowing at node 914 provides the bias voltage which controls the bias transistor 908 so as to increase or decrease the amount of current flowing through bias transistor 908. The transistor 904 is coupled in series with the load transistor 902 to provide the current $I_4$.

With continued reference to FIG. 9, the voltage at the output 801 is "replicated" from the charge pump voltage $V_{CP}$. That is, in response to a variation in amplitude of the charge pump voltage $V_{CP}$, the bias current flowing through transistor 908 will increase or decrease accordingly. The differential amplifier 940 is configured in a unity gain mode to track the voltage at the output 916 with the voltage applied to the non-inverting input 917. The operational amplifier 104 tracks variations at output 801 for a wide range of operating frequencies. This wide range of operation, along with the charge pump current scaling, provides a constant bandwidth to operating frequency ratio and a wide locking range. In addition, by utilizing the charge pump voltage $V_{CP}$, an operational amplifier power dissipation characteristic may scale with the operating frequency. That is, the operational amplifier power consumption may decrease in accordance to a scale factor as the operating frequency correspondingly decreases.

The enable/disable circuitry is comprised of transistor 905, 906, and 907. The transistor 905 receives enabling signal EN and is coupled in series with input transistor 903. The enabling signal EN operates to enable or disable a current flowing through the transistor 905. Thus, in response to the enabling signal EN, a current flows through transistor 905 and a ground voltage is coupled to the third differential transistor 903. In the absence of an enabling signal, the source electrode of the third differential transistor 903 is isolated.

The transistor 906 is coupled to load transistors 901 and 902. In response to a disable signal EN\, the operational amplifier 104 may be placed in the non-active state. In particular, the bias generating feature of the bias generator 930 is disabled in response to the disable signal EN\. When in the non-active or power down state, the power consumption of the operational amplifier 104 decreases.

The transistor 907 is coupled to bias transistor 908. In response to a disable signal EN\, the transistor 907 disables bias transistor 908 thereby placing the differential amplifier 940 in the non-active state. As mentioned above, in the non-active or power down state, the power consumption by the operational amplifier 104 decreases.

By synchronously applying complementary enable/ disable signals, EN and EN\, to transistors 905, 906 and 907, related current flows are logically enabled or disabled as described above. This provides an overall maximum power saving feature to the operational amplifier 104.

With continued reference to FIG. 9, in a preferred embodiment, the current mirror load transistors 909 and 910 have channel widths which are sufficiently wide so that these transistors operate in a saturation mode while the clock alignment system is in a delay line lock condition and a minimum power supply voltage, process variation, and temperature fluctuation state. Under these circumstances, the operational amplifier 104 may exhibit enhanced characteristics of power supply rejection at high operating frequencies.

The operational amplifier 104 of the present invention outputs a power supply voltage $V_C$ for a plurality of delay line elements in a delay line or ring oscillator. The charge pump voltage $V_{CP}$ is used in providing a corrected power supply voltage to the plurality of delay line elements. As mentioned above, the charge pump voltage $V_{CP}$ is an integrated phase error or delay error representation of any variations between a reference clock and an output clock. These variations may be a product of power supply or other sources of noise.

The power supply voltage $V_C$ may be used in a core of a clock alignment system (for example, a DLL). Such a clock alignment system may be provided with improved sensitivity to supply voltage, semiconductor processing and temperature variations. A wide operating range is also provided in the present invention. In addition, power consumption may decrease proportionally with operating frequency to minimize the power dissipation.

Figure 10:
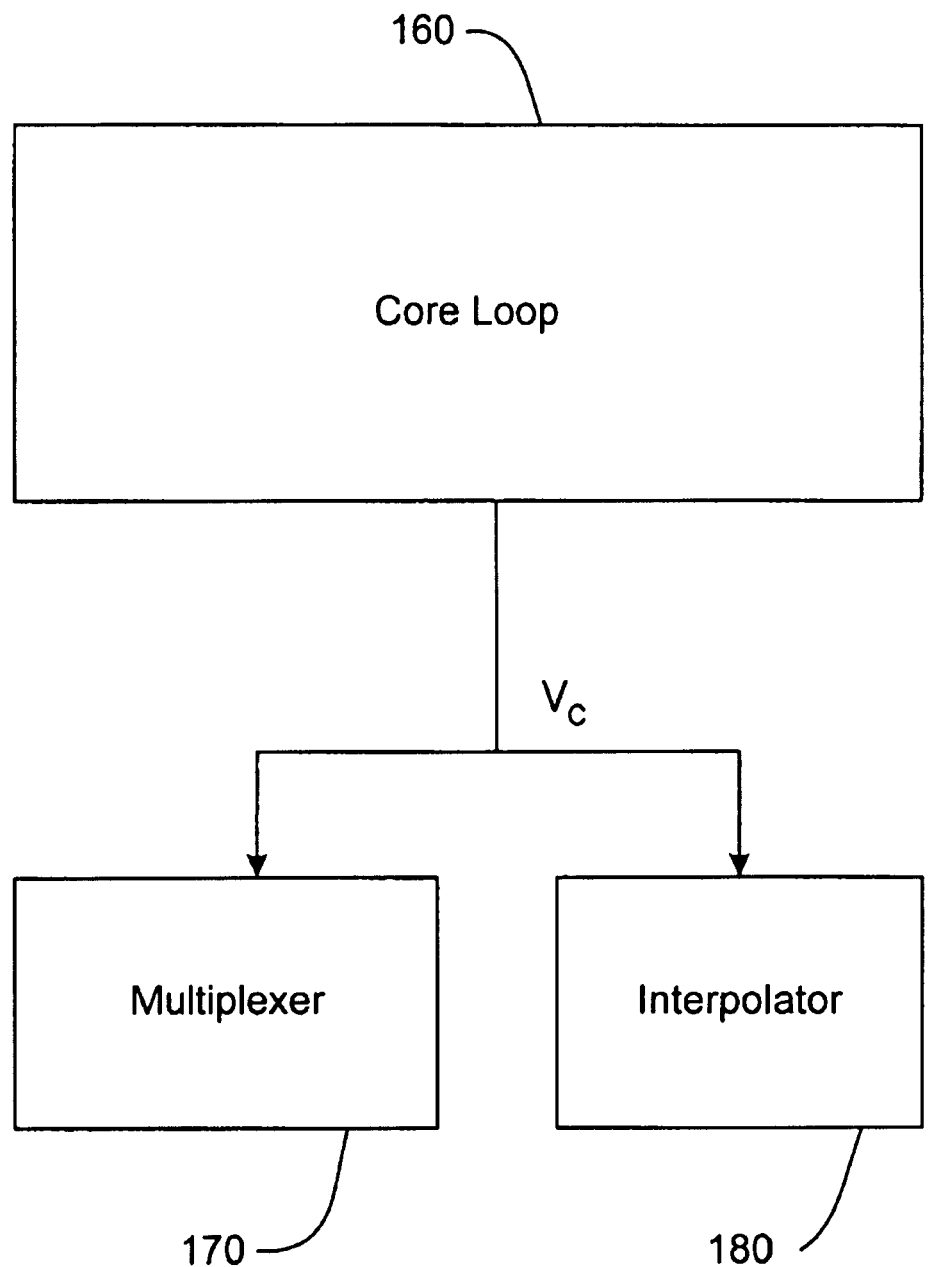
FIG. 10 is a schematic block diagram of clock alignment system according to one embodiment of the present invention.

With reference to FIG. 10, the supply voltage generated in clock compensation circuitry 100 of FIG. 5 is employed as a core loop 160 in a clock alignment system 150 (for example, a DLL type clock alignment system). The supply voltage $V_C$ is used to supply common multiplexor circuitry 170 and common interpolator circuitry 180 used to fine tune the output clock signal. Such a clock alignment may be provided with improved sensitivity since the supply voltage compensates for any effects generated in response to supply voltage, semiconductor processing, and temperature variations.

In summary, the power supply circuit of the present invention provides immunity from noise and supply fluctuations. The power supply circuit may provide power to a delay line. In addition, the power supply circuit may be included in a feedback system of the clock alignment circuit to minimize effects due to process and temperature variations. By doing so, a reliable operation may be maintained within a temperature range across different semiconductor process platforms.

While this invention has been described in connection with what is presently considered to be the most practical and preferred embodiment, it is to be understood that the invention is not limited to the disclosed embodiment. On the contrary, it is intended that various modifications within the spirit and scope of the appended claims are covered. For example, various modifications may be made to the clock alignment circuitry to incorporate important features. A feature such as "nap" may be implemented by qualifying the phase inputs of the charge pump with extra logic gates, and furthermore, a "reset" feature may be included by adding additional reset transistors to the circuit structure.

What is claimed is:

1. A clock alignment circuit comprising:

delay line having a plurality of delay elements, wherein each delay element of the plurality of delay elements includes a supply electrode to receive a supply voltage, to generate a delayed clock signal with respect to a reference clock signal;

a comparator, coupled to the delay line, to compare the delayed clock signal and the reference clock signal and to output delay differential information, wherein the delay differential information is representative of a correction information between the reference clock signal and the delayed clock signal;

charge pump circuitry, coupled to the comparator, to convert the delay differential information to a control signal, wherein the control signal is proportional to the delay differential information;

an amplifier coupled to the charge pump circuitry, wherein the amplifier includes:
a first input to receive the control signal;
a second input to receive a feedback signal; and
an output to provide the supply voltage and the feedback signal;

a capacitor coupled between the supply voltage and a secondary power supply, wherein the amplifier further includes:
a current mirror load having a first and a second load transistor coupled in parallel, the first and the second load transistors each having a supply electrode coupled to a first supply voltage;
a bias transistor coupled to a second supply voltage, the bias transistor responding to a bias voltage to provide a bias current at a drain electrode;
a first differential input transistor having a source coupled to the drain electrode of the bias transistor, wherein the first differential input transistor is coupled in series with the first load transistor; and
a second differential input transistor having a source coupled to the drain electrode of the bias transistor, wherein the second differential input transistor is coupled in series with the second load transistor.

2. The clock alignment circuit of claim 1, wherein the first and the second input load transistors are PMOS type transistors, the first and the second differential input transistors are NMOS type transistors, the first supply voltage is a VDD supply voltage, and the second supply voltage is a ground.

3. The clock alignment circuit of claim 1, further including a disabling transistor coupled to a gate electrode of the bias transistor, to disable the bias transistor in response to a disable signal.

4. The clock alignment circuit of claim 1, further including a bias generator to provide the bias voltage, the bias generator includes:

a second current mirror load including a third and a fourth load transistor coupled in parallel, the third and the fourth load transistors each having a source coupled to a third supply voltage;

a third input transistor having a source coupled to a fourth supply voltage, wherein the third input transistor is coupled in series with the third load transistor; and a fourth input transistor having a source coupled to a fifth supply voltage, wherein the fourth input transistor is coupled in series with the fourth load transistor.

5. The clock alignment circuit of claim 4, wherein the third and the fourth load transistors are PMOS type transistors, and the third and fourth input transistors are NMOS type transistors, the third supply voltage is a VDD voltage, and the fourth and the fifth supply voltages are ground.

6. A clock alignment circuit comprising:
   a delay line having a plurality of delay elements, wherein each delay element of the plurality of delay elements includes a supply electrode to receive a supply voltage, to generate a delayed clock signal with respect to a reference clock signal;
   a comparator, coupled to the delay line, to compare the delayed clock signal and the reference clock signal and to output delay differential information, wherein the delay differential information is representative of a correction information between the reference clock signal and the delayed clock signal;
   charge pump circuitry, coupled to the comparator, to convert the delay differential information to a control signal, wherein the control signal is proportional to the delay differential information;
   an amplifier coupled to the charge pump circuitry, wherein the amplifier includes:
      a first input to receive the control signal;
      a second input to receive a feedback signal; and
      an output to provide the supply voltage and the feedback signal;
   a capacitor coupled between the supply voltage and a secondary power supply,
   wherein the charge pump circuitry includes:
   a first current source to receive a first supply voltage, the first current source having a control electrode to receive a bias control signal;
   a first load transistor coupled to a first reference terminal;
   a first input transistor coupled in series between the first current source and the first load transistor, the first input transistor responds to a first phase input to provide a first pump output;
   a second current source receiving a second supply voltage, the second current source having a control electrode to receive the bias control signal;
   a second load transistor coupled to a second reference terminal, wherein the second load transistor responds to the first pump output;
   a second input transistor coupled in series between the second current source and the second load transistor, the second input transistor responsive to a second phase input to provide a charge pump output; and
   a current source control coupled between a third supply voltage and a third reference terminal, the current source control includes a control input transistor responsive to the charge pump output and a current source control to provide the bias control signal, wherein the bias control signal is responsive to the charge pump output; and
   a capacitor coupled between the charge pump output and a fourth reference terminal, wherein the charge pump output provides the control signal.

7. The clock alignment circuit of claim 6, wherein the first, second and the third supply voltages are a VDD voltage, and the first, the second, the third and the fourth reference terminals are a ground terminal.

8. The clock alignment circuit of claim 6, wherein the charge pump circuitry further includes:
   a third input transistor coupled in series with the first current source, wherein the third input transistor includes a gate electrode responsive to a third phase input;
   a third load transistor coupled between a fifth reference terminal and the third input transistor;
   a fourth input transistor coupled in series with the second current source, wherein the fourth input transistor includes a gate electrode responsive to a fourth phase input; and
   a fourth load transistor coupled between a sixth reference terminal and the fourth input transistor.

9. The clock alignment circuit of claim 6, wherein the first and third phase inputs are complementary and the second and fourth phase inputs are complementary.

10. A clock alignment circuit comprising:
    a delay line having a plurality of delay elements, wherein each delay element of the plurality of delay elements includes a supply electrode to receive a supply voltage, to generate a delayed clock signal with respect to a reference clock signal;
    a comparator, coupled to the delay line, to compare the delayed clock signal and the reference clock signal and to output delay differential information, wherein the delay differential information is representative of a correction information between the reference clock signal and the delayed clock signal;
    charge pump circuitry coupled to the comparator, to convert the delay differential information to a control signal, wherein the control signal is proportional to the delay differential information;
    an amplifier coupled to the charge pump circuitry, wherein the amplifier includes:
       a first input to receive the control signal;
       a second input to receive a feedback signal;
       an output to provide the supply voltage and the feedback signal responsive to the control signal; and
    a multiplexer circuit and an interpolator circuit, wherein the supply voltage is provided to the multiplexer circuit and the interpolator circuit.

11. A power supply generator for generating a first supply voltage for clock alignment circuitry wherein the clock alignment circuitry includes a delay line having a plurality of delay elements, each delay element of the plurality of delay elements includes a source electrode to receive the first supply voltage, the delay line generating a delayed clock using a reference clock, the clock alignment circuitry further including a comparator to detect a correction information between the delayed clock and the reference clock to generate error information representative of the correction information, and a charge pump to convert the error information into a control signal, wherein the control signal is proportional to the error information, the power supply generator comprising:
    an operational amplifier having an output to provide the first supply voltage, wherein the operational amplifier includes:
       a bias transistor biased by a bias voltage;
       a differential amplifier coupled to the bias transistor, wherein the differential amplifier includes a first differential input to receive the control signal and a second differential input coupled to the output in an inverting configuration;
       a bias generator to provide the bias voltage, the bias generator having a first input coupled to the control signal and a second input to receive the bias voltage;
       wherein, in response to the control signal, the bias generator provides the bias voltage representative of a change in the control signal; and
    a capacitor coupled between the output and a supply terminal.

12. The power supply generator of claim 11, wherein the differential amplifier further includes:
- a first current mirror load circuit having a first and a second load transistor coupled in parallel, the first and the second load transistors each having a source electrode coupled to a second supply voltage;
- a first input transistor having a source electrode coupled to a drain electrode of the bias transistor, wherein the first input transistor is coupled in series with the first load transistor and responsive to the first differential input; and
- a second input transistor having a source electrode coupled to the drain electrode of the bias transistor, wherein the second input transistor is coupled in series with the second load transistor and responsive to the second differential input.

13. The power supply generator of claim 12, wherein the first and the second load transistors are PMOS type transistors, the first and the second input transistors are NMOS type transistors, the second supply voltage is a VDD voltage, and a third supply voltage is coupled to the bias transistor, wherein the third supply voltage is a ground.

14. The power supply generator of claim 13, wherein a channel width of the first load transistor and a channel width of the second load transistor are sized such that, when in operation, the first and the second load transistors are in a saturated mode.

15. The power supply generator of claim 11, further including a disabling transistor, coupled to a gate electrode of the bias transistor, to disable the bias transistor in response to a disable signal.

16. The power supply generator of claim 12, wherein the bias generator further includes:
- a second current mirror load circuit having a third and a fourth load transistor coupled in parallel, the third and the fourth load transistors of the second current mirror load circuit each having a source electrode coupled to a third supply voltage;
- a third input transistor having a source electrode coupled to a fourth supply voltage, wherein the third input transistor is coupled in series with the third load transistor, wherein the third input transistor includes a gate electrode to receive the control signal; and
- a fourth input transistor having a source electrode coupled to a fifth supply voltage, wherein the fourth input transistor is coupled in series with the fourth load transistor.

17. The power supply generator of claim 16 wherein the first, the second, the third and the fourth load transistors are PMOS type transistors, the first, the second, the third and the fourth input transistors are NMOS type transistors, the second and the third supply voltages are a VDD voltage, and the forth and fifth supply voltages are a ground.

18. The power supply generator of claim 16, wherein the bias generator further includes a disabling transistor coupled to the second current mirror load circuit, to disable a second current mirror bias.

19. The supply generator of claim 11, wherein the clock alignment circuitry includes a delay lock loop.

20. A method of generating a supply voltage for use in clock compensation circuitry, the clock compensation circuitry includes a plurality of delay elements in a delay line and receives a clock signal, the method comprising:
- providing the supply voltage to a common source electrode of the plurality of delay elements;
- providing a delayed clock signal using the delay line, the delayed clock signal having a time delay with respect to the clock signal;
- detecting a delay skew between the delayed clock signal and the clock signal;
- converting the delay skew to a voltage signal wherein the voltage signal is proportional to the delay skew; and
- tracking the voltage signal using an amplifier to generate the supply voltage,
- wherein the amplifier includes a differential amplifier biased by a current source, the differential amplifier including a first differential input, a second differential input and an output to provide the supply voltage, wherein tracking the voltage signal includes:
- receiving the voltage signal at the first differential input;
- applying the output to the second differential input;
- amplifying a voltage differential between the first differential input and the second differential input;
- biasing the current source with a bias signal; and
- generating the supply voltage at the output, wherein the supply voltage is proportional to the voltage differential.

21. The method of claim 20, wherein the amplifier further includes a bias generator having a first input, a second input, and an output to provide the bias signal, and wherein biasing the current source includes:
- receiving the voltage signal at the first input;
- applying the output of the bias generator the second input;
- amplifying a voltage differential between the first input and the second input; and
- generating the bias signal at the output of the bias generator, wherein the bias signal is proportional to the voltage differential between the first input and the second input.

* * * * *